April 8, 1958 E. P. THIAS 2,830,182

COMBINATION FREQUENCY SELECTOR

Filed Dec. 17, 1953 6 Sheets-Sheet 1

INVENTOR.
EDWIN P. THIAS
BY Ostrolenk & Faber
ATTORNEYS

April 8, 1958 E. P. THIAS 2,830,182

COMBINATION FREQUENCY SELECTOR

Filed Dec. 17, 1953 6 Sheets-Sheet 2

INVENTOR.
EDWIN P. THIAS

BY Ostrolenk & Faber

ATTORNEYS

COMBINATION FREQUENCY SELECTOR

Filed Dec. 17, 1953 6 Sheets-Sheet 3

INVENTOR.
EDWIN P. THIAS

BY Ostrolenk & Faber

ATTORNEYS

COMBINATION FREQUENCY SELECTOR

Filed Dec. 17, 1953 6 Sheets-Sheet 4

INVENTOR.
EDWIN P. THIAS

BY Ostrolenk & Faber

ATTORNEYS

April 8, 1958 E. P. THIAS 2,830,182

COMBINATION FREQUENCY SELECTOR

Filed Dec. 17, 1953 6 Sheets-Sheet 5

INVENTOR.
EDWIN P. THIAS

BY Ostrolenk & Faber

ATTORNEYS

COMBINATION FREQUENCY SELECTOR

Filed Dec. 17, 1953 6 Sheets-Sheet 6

INVENTOR.
EDWIN P. THIAS

BY Ostrolenk & Faber

ATTORNEYS

United States Patent Office 2,830,182

Patented Apr. 8, 1958

2,830,182

COMBINATION FREQUENCY SELECTOR

Edwin P. Thias, Los Angeles, Calif., assignor to Standard Coil Products Co., Inc., Los Angeles, Calif., a corporation of Illinois Application December 17, 1953, Serial No. 398,772

8 Claims. (Cl. 250—40)

My present invention relates to television tuners and more particularly it relates to discrete type tuners operable in the V. H. F. and U. H. F. ranges.

In co-pending application Serial No. 325,514, filed December 12, 1952, now Patent No. 2,773,986, a discrete type tuner was disclosed comprising two turrets mounted on concentric shafts of which one selected U. H. F. channels, the other V. H. F. channels. A switch was provided so that during U. H. F. reception, the V. H. F. section of the tuner would be disconnected from the V. H. F. tuning elements connected to another group of tuning elements and would perform as an amplifier. When a V. H. F. channel was desired, this switch provided a connection between the tuning elements of the V. H. F. section and stationary mounted elements of the V. H. F. section.

In order to select a channel within a given band, U. H. F. or V. H. F., it was first necessary to switch in the desired band and then by operation of a second control the individual channel within that band was selected. In addition, fine tuning means were provided in both the U. H. F. and V. H. F. section to fine tune after discrete selection of the desired channel.

In other words, the switch contacts must be capable of providing good electrical connections at two different points, one point corresponding to the connection with the V. H. F. turret, the other point corresponding to the connection with the auxiliary circuit.

The position of the previously mentioned switch was determined by the U. H. F. turret so that in one position of the U. H. F. turret the switch would take a certain position while in all the other positions of the U. H. F. turret, the switch would take a second position.

The control mechanism of the switch mechanism consists in the present invention of a cam surface forming an integral part with the U. H. F. turret engaging a cam follower having a shaft positioned so that it can operate the switch to either of its two positions. The cam following and the shaft are appropriately biased against the cam surface, and the cam surface in this particular embodiment has a number of similar notches and two dissimilar notches. One of the dissimilar notches causes the cam follower and, therefore, the switch structure to take the position corresponding to V. H. F. reception under all conditions. The other dissimilar notch through operation of a sliding member may cause the cam follower and therefore the switch structure to take the position for either V. H. F. or U. H. F. reception.

It may be necessary at this point to recall the fact that there are 12 V. H. F. channels numbered 2 to 13, inclusive, in addition to the U. H. F. channels 14 to 84. The 12 V. H. F. channels occupy a frequency range extending from 54 megacycles (channel 2) to 216 megacycles (channel 13). The U. H. F. channels instead occupy a frequency range from 470 to 890 megacycles.

If then (1) a desired system of tuning is used, that is one in which the television frequency range is divided in bands of 10 channels each, for example, band 3 comprises channels 30–39, and (2) if the U. H. F. and V. H. F. tuning means are different and separate but the same channel positioning means are used for both V. H. F. and U. H. F. channels, and (3) in view of the fact that there are 12 V. H. F. channels, the cam mechanism for operating this switch must be such that it will be possible to tune from V. H. F. channel 13 to U. H. F. channel 14 by continuous rotation of one member without having to operate other control means for selection of the U. H. F. or V. H. F. ranges.

The complete turret assembly consisting of a U. H. F. and a V. H. F. turret and their shafts is mounted in the tuner chassis which is essentially divided also in two sections, the U. H. F. section and the V. H. F. section separated appropriately by a shield.

The chassis is provided at its two end walls with pockets obtained through stamping of the metallic chassis so that a simple spring clip without any hooks can be used to engage the two ends of the operating shafts and the above mentioned pockets of the chassis to securely mount the turret assembly against movement of the turret assembly away from the chassis. That such a movement away from the chassis may be possible without the use of these spring clips is obvious when it is considered that in the present tuner two detent discs are used requiring, therefore, two spring members provided with rollers biased against the notches of the positioning discs. In addition, the stationary contact structures will also tend to bias the turrets away from the chassis.

In addition to the turret structures, the present tuner is provided with, as previously mentioned, fine tuning means, one for fine tuning in U. H. F. channels, the other for fine tuning in V. H. F. channels.

The fine tuners are essentially capacitors, the capacitance variation of which is obtained by moving a dielectric plate with respect to the two conductive plates of the capacitor assembly. The two dielectric plates are mounted on a single shaft and operated by rotation of a sleeve concentric with the shafts of the turrets.

The U. H. F. panels described above are mounted on two supporting discs rigidly secured to a sleeve concentric with the shaft of the V. H. F. turret. One of these mounting discs is provided with extending fingers to engage an opening at one end of the panels. The other disc is provided with notches which are engageable by a protruding member of the U. H. F. panels. This second disc is metallic and its notches also serve for positioning purposes when engaged by an appropriate detent mechanism.

The extension of the U. H. F. panels is provided with shoulders such that a spring member mounted on the outside of this turret on the second disc and having a circumferentially bent portion engages the shoulders of the extension of the U. H. F. panels so that the bent portion of this spring biases these panels against the second disc.

Removal of the panels from the turret can then be obtained by moving the panel away from the turret in the radial direction, overcoming the position presented by the disc mounted spring member.

Such positioning means are particularly necessary at ultra-high frequencies where it is well-known any slight displacement with respect to a preselected position of the panels may cause detuning and consequent loss of picture.

The positioning of the oscillator tube of the U. H. F. section is at an angle with respect to the vertical direction so as to permit not only the mounting of the tuner near the cathode ray tube but also adjustment of elements mounted on the same side of the tuner on which the tubes are mounted.

The foregoing and many other objects of the invention will become apparent in the following description and drawings in which:

Figure 1 is a circuit diagram of the tuner of the present invention.

Figure 2 is an exploded view of the tuner of the present invention showing the chassis of the tuner and the elements mounted on the chassis and the V. H. F.–U. H. F. turrets.

Figure 2a is a side view of the tuner of the present invention showing the positioning means and the fine tuning mechanism.

Figure 3 is a top view of the tuner of the present invention showing the U. H. F. crystal mounting means and the U. H. F. and V. H. F. inputs.

Figure 4 is a detail view of the terminal of the V. H. F. section connections taken along line 4—4 of Figure 3 looking in the direction of the arrows.

Figure 5 is a top view of a detail of the tuner of the present invention showing the U. H. F. input filtering means and the crystal mounting means. In this figure the upper part of the U. H. F. chassis has been removed.

Figure 6 is a detail view of the crystal mounting means and crystal of the U. H. F. tuner taken at line 6—6 of Figure 3 looking in the direction of the arrows.

Figure 7 is a side view of the U. H. F. turret with all the U. H. F. panels removed except one.

Figure 8 is a top view of one embodiment of the U. H. F. panels.

Figure 12:
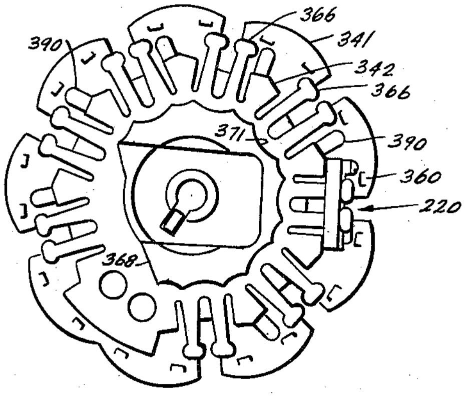

Figure 12 is the rear view of the U. H. F. turret.

Figure 13:
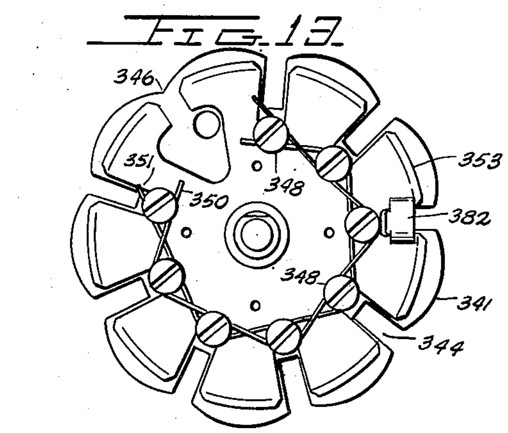

Figure 13 is the front view of the U. H. F. turret showing one U. H. F. panel mounted, the panels biasing spring member and the adjusting screws.

Figure 14:
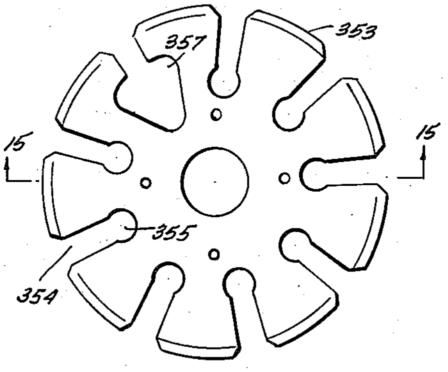

Figure 14 is a front view of the spring member used in the supporting disc of Figure 13.

Figure 15:
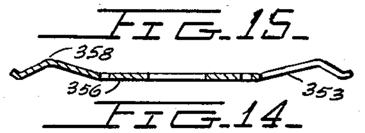

Figure 15 is a cross sectional view taken at line 15—15 of Figure 14 of the spring member of the supporting disc shown in Figure 13.

Figure 2:
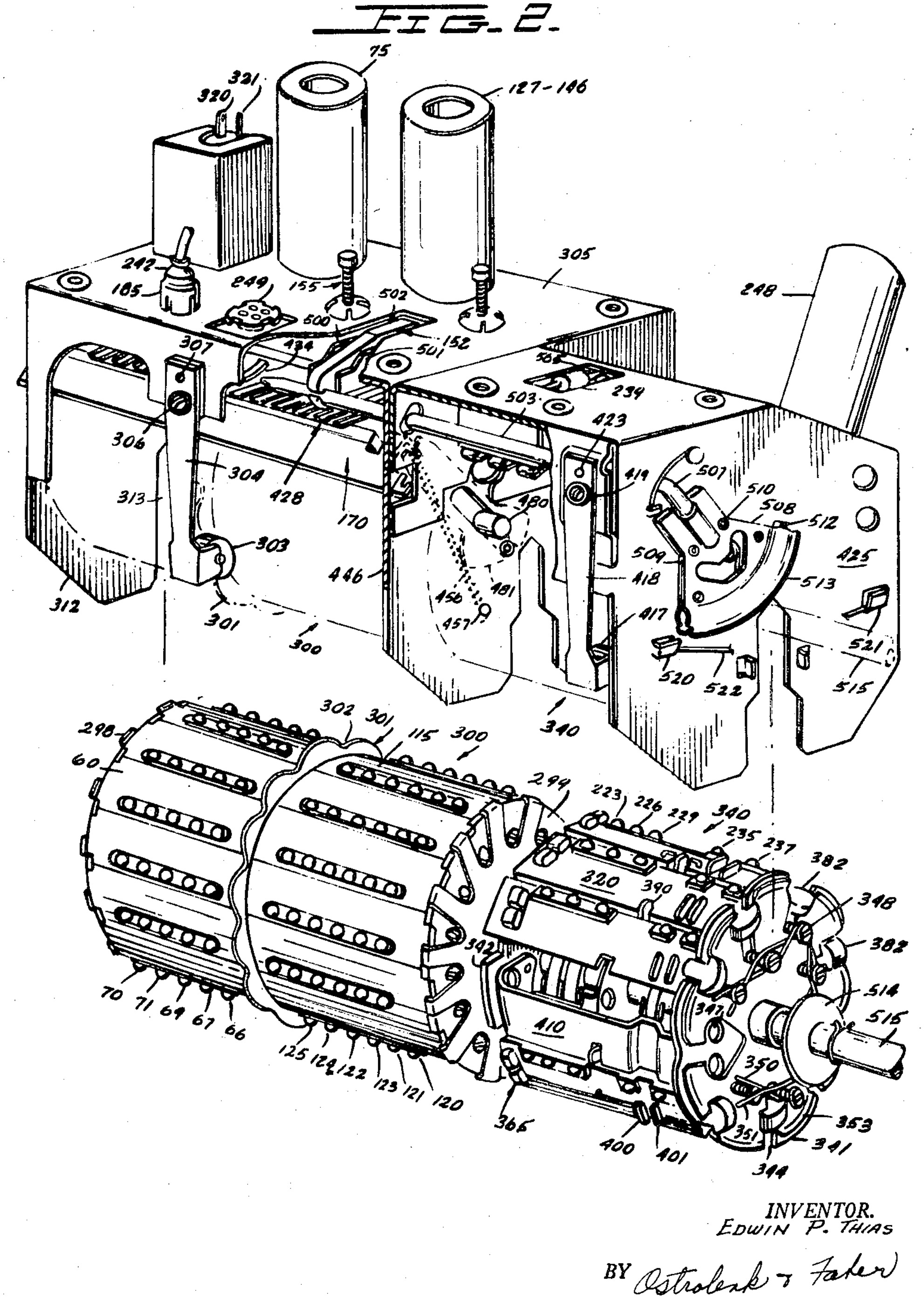
Figure 2A:
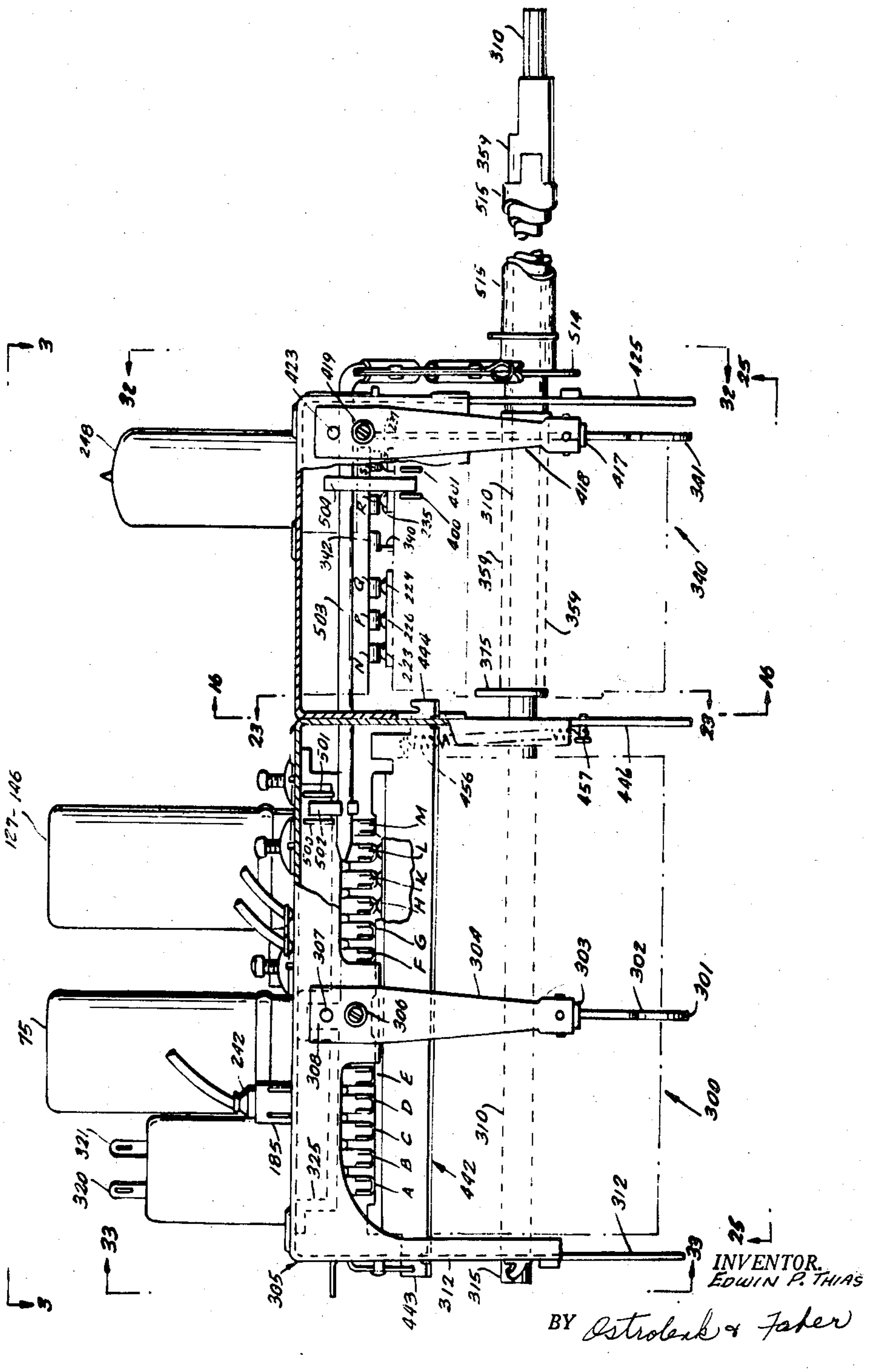
Figures 16, 17, 20:
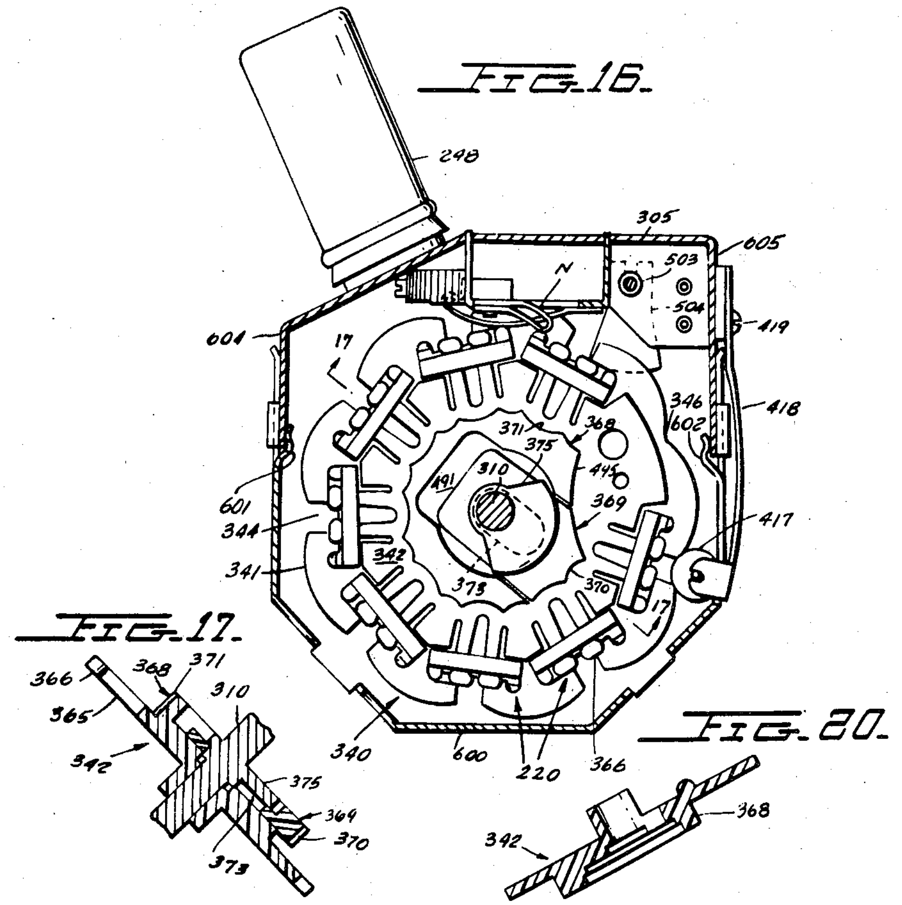

Figure 16 is a cross-sectional view taken at line 16—16 of Figure 2a looking in the direction of the arrows and showing the cam carrying portion of the U. H. F. turret.

Figure 17 is an assembly drawing taken at line 17—17 of Figure 16 looking in the direction of the arrows.

Figures 18, 19, 21, 22:
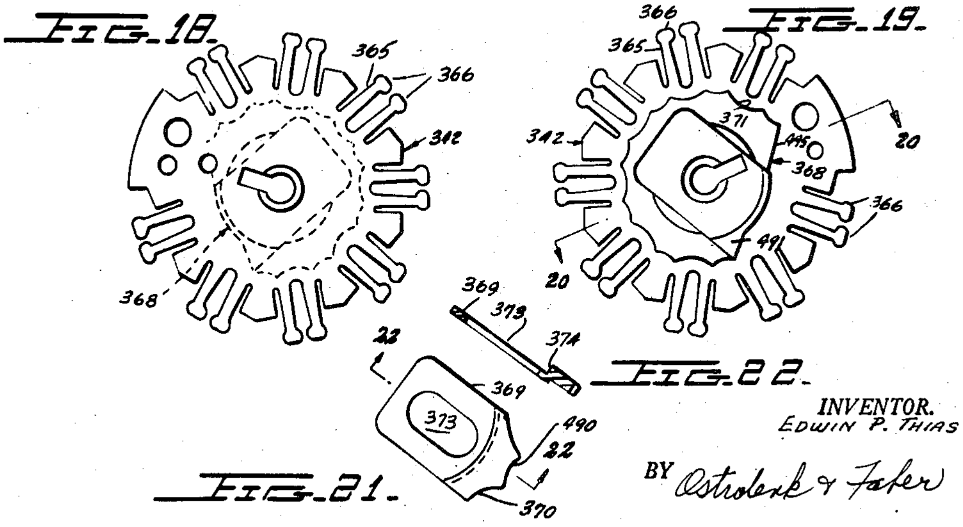

Figure 18 is a detail view of the cam supporting disc of the U. H. F. turret.

Figure 19 is another view of the disc of Figure 18.

Figure 20 is a cross sectional view taken at line 20—20 of Figure 19 looking in the direction of the arrows.

Figure 21 is a detail view of the movable member of the cam mechanism of the present invention.

Figure 22 is a cross-sectional view taken at line 22—22 of Figure 21 looking in the direction of the arrows.

Figure 1:
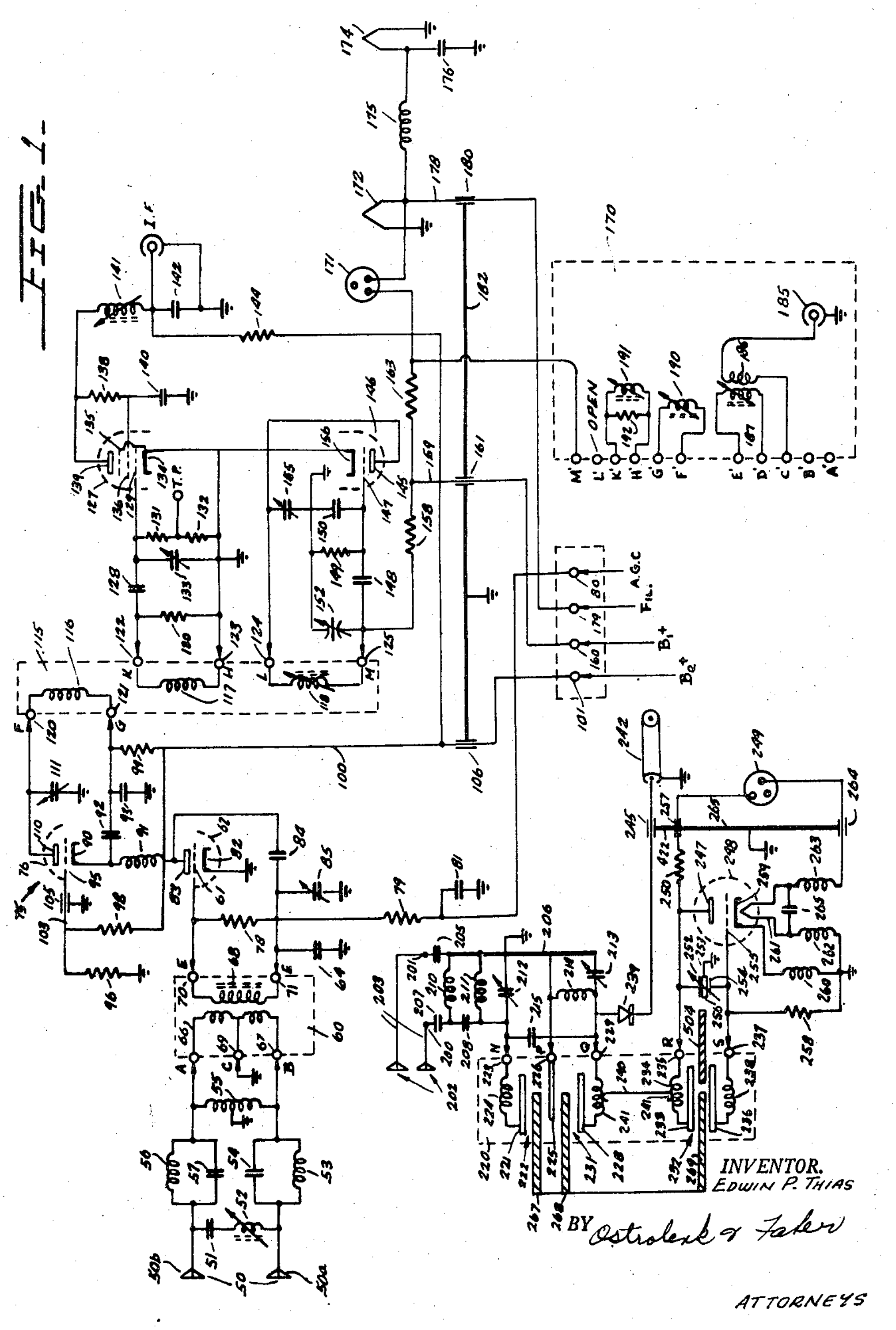

Referring first to Figure 1 showing the schematic circuit diagram of the present U. H. F.–V. H. F. tuner, the V. H. F. antenna 50 which is shown here as a balanced antenna is connected to a series circuit consisting of a capacitance 51 and a variable inductance 52. Variable inductance 52 may consist of a coil with a conductive slug within it so that displacement of the slug with respect to the coil produces the desired variation in inductance. Across the balanced output of this coil assembly is placed a balanced center tapped coil (iron core) 55.

To be more specific, section 50a of V. H. F. antenna 50 is connected to the free end of inductance 52 while the other side, 50b, of antenna 50 is connected to the free end of capacitor 51.

Antenna section 50a is also connected to a parallel circuit consisting of an inductance 53 and a capacitance 54. The other side of the parallel circuit 53—54 is connected to a fixed terminal B°. Similarly, section 50b of antenna 50 is connected to the parallel circuit consisting of inductance 56 and capacitance 57. This parallel circuit is connected on the other side to a stationary contact A.

Figures 3, 4, 5, 6:
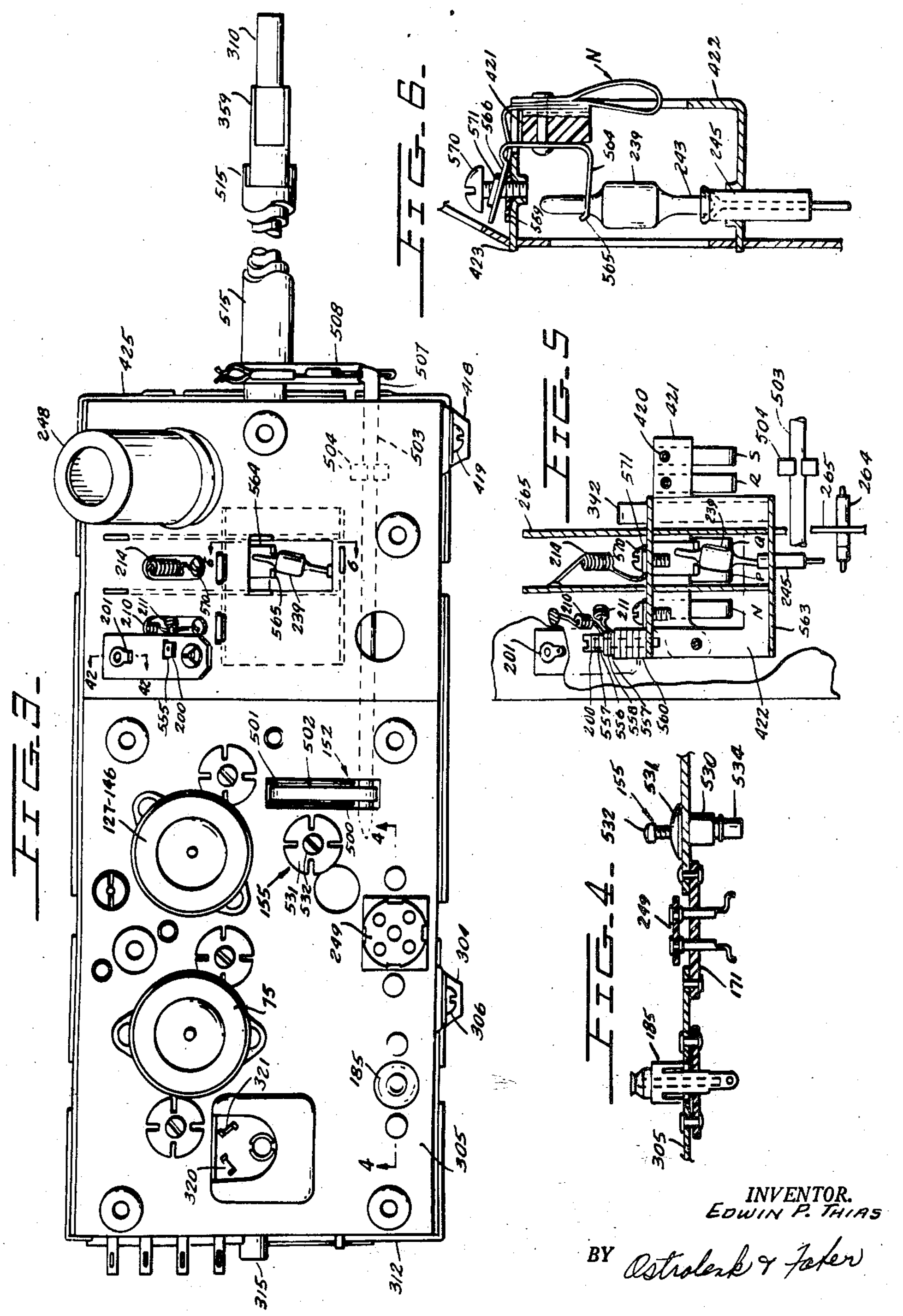

It should be noted that aside from the antenna 50 and the transmission line from the antenna to the series circuit 51—52, the other components described above are fixedly mounted on the chassis of the tuner as shown hereinafter in connection with Figures 2 and 3.

When the tuner is set for V. H. F. reception, that is, for reception on an individual V. H. F. channel, an antenna segment 60 mounted on the V. H. F. turret also described hereinafter is connected to the fixed terminals A and B and the other fixed terminals C, D, E on the input side of the V. H. F. tuner.

Contact C is a fixed contact connected to ground. Contact E is connected to the grid 61 of grounded cathode triode 62. Contact D is connected to ground through by-passing capacitor 64.

Mounted on panel 60 is an input transformer having its primary side 65 balanced to ground through connection of its two ends to stationary contacts A and B respectively by means of appropriate movable contacts 66 and 67 mounted on panel 60.

Primary coil 65 is center tapped and the center tap is connected to a movable contact 69 which in turn engages contact C, thus grounding the center tap of coil 65. Also mounted on panel 60 is a secondary 68 of transformer 65—68. Secondary 68 has its terminals connected to movable contacts 70 and 71, which engage the stationary contacts E and D respectively.

It will now be apparent that the transformer 65—68 mounted on panel 60 serves not only as an input coupling device, but also as a means for transforming a balanced input signal into an unbalanced signal. The unbalanced signal which appears across stationary contacts E and D is supplied to the grid 61 of grounded cathode triode 62 of R. F. amplifier 75. R. F. amplifier 75 consists of two triodes 62 and 76 connected in cascode.

To be more specific, stationary contact E is connected not only to grid 61 of tube 62, but also through a series circuit consisting of resistances 78 and 79 to a terminal 80 to which, as noted in Figure 1, an A. G. C. voltage may be applied as a bias.

A capacitance 81 connected between resistance 79 and contact 80 serves to by-pass to ground A. C. signals which would otherwise cause fluctuations and therefore distortion in the output of triode 62. Cathode 82 of triode 62, as previously mentioned, is grounded while plate 83 of tube 62 is connected on one side to a series capacitance 84 and to contact D.

In parallel to the previously mentioned capacitance 64 is also a trimmer capacitor 85. On the other side, plate 83 of tube 62 is connected to cathode 90 of grounded grid triode 76 through a series inductance 91. Cathode 90 is connected to ground through capacitance 92 in series with a second capacitance 93. Grid 95 of triode 76 is grounded through resistance 96 connected between grid 95 and ground and is connected to the common point between capacitances 92 and 93 through series resistances 98 and 99. The common point between resistances 98 and 99 is connected through conductor 100 to a stationary contact 101 to which, during operation of the tuner, a $B+_2$ supply is connected.

To ensure proper operation of the R. F. amplifier, lead 103 between resistance 96 in grid 95 is by-passed to ground by means of a feed-through capacitor 105 and lead 100 is by-passed to ground through a feed-through capacitor 106.

Finally, plate 110 of triode 76 is connected to a trimmer capacitor 111 connected between plate 110 and ground and to a stationary contact F. The common point between capacitances 92 and 93 and resistance 99 is connected to another stationary contact G.

During operation of the tuner, a second panel 115 is connected to stationary contacts FG, KH, LM. Mounted on panel 115 are three tuning elements, in this case, three inductances 116, 117 and 118. Inductance 116 terminates at the panel mounted contacts 120 and 121, which engage respectively stationary contacts F and G. Inductance 117 terminates at panel mounted contacts 122 and 123 which engage stationary contacts K and H. Finally, inductance 118 terminates at movable contacts 124, 125 which engage stationary contacts L and M respectively.

While inductance 116 and inductance 117 are fixed inductances, inductance 118 is variable and generally of a slug tuned type. Since inductances 116, 117 and 118 are mounted in the same panel 115 and are not shielded from each other, there will be mutual coupling between the three inductances so that a signal appearing, for example, across inductance 116 would be coupled to inductance 117, and a signal appearing across inductance 118 would also be coupled to inductance 117.

Inductance 117 which is connected to stationary contacts K and H, is in the input of converter tube, in this case a pentode 127, through a coupling capacitor 128 connected between contact K and grid 129 of pentode 127. Contact K is connected to ground through resistance 130 and grid 129 is connected to ground through the series combination of resistances 131 and 132. A terminal is brought out from the common point of resistances 131 and 132 to permit testing of the tuner and is therefore designated as T. P. in Figure 1.

Across the resistance combination 131 and 132 is connected a trimmer capacitor 133. Cathode 134 of converter 127 is connected to ground and to suppressor grid 135. Screen grid 136 of tube 127 is connected through a dropping resistance 138 to plate 139 of tube 127 and is by-passed to ground by capacitor 140 connected between screen grid 136 and ground.

The output from converter tube 127 is obtained through a circuit consisting of a variable inductance 141 and a capacitance 142 connected in series between plate 139 of tube 127 and ground. The I. F. output of the present tuner is actually obtained from across capacitor 142 and is brought out to a receptacle mounted on the chassis of the tuner. The common point between elements 141 and 142 is connected to lead 100 and therefore to the $B+_2$ supply through a dropping resistance 144.

Oscillator coil 118 is connected on one side through contact L to plate 145 of oscillator triode 146. The other side of inductance 118 is connected to the grid 147 of tube 146 through a coupling capacitor 148 and a grid leak resistance 149. Capacitor 148 is connected between contact M and grid 147 while grid leak resistor 149 is connected between ground and grid 147.

Also connected between ground and grid 147 is capacitor 150. While a fine tuning capacitor 152 is connected between stationary contact M and ground, another trimmer capacitor 155 connects contact L to ground. Also connected to ground is cathode 156 of oscillator tube 146. Contact M is connected to the $B+_1$ supply through a resistor 158, lead 159, terminal 160. Lead 159 is properly by-passed to ground by means of feed through capacitor 161.

Also connected to lead 159 is a resistance 163 connected on the other side to a contact M′ of the auxiliary assembly 170. Resistor 163 is also connected to a receptacle 171 mounted on the chassis of the present tuner. To another contact of the same receptacle is connected one side of filament 172 for the double triode tube 62—76. The other side of filament 172 is grounded. The ungrounded side of filament 172 is connected to filament 174 of tube 127—146 through a R. F. choke 175. Filament 174 is thus connected on one side to choke 175 and on the other side to ground.

A capacitance 176 is also connected to the ungrounded side of filament 174 to by-pass high frequencies. The common point between filament 172 and choke 175 is connected to a lead 178 which terminates at a contact 179 to which, during the operation of the tuner, a filament supply would be supplied. Lead 178 is also by-passed to ground through a feed through capacitor 180.

It should be apparent later, when describing the actual configuration of the V. H. F. tuner, that feed through capacitors 106, 161 and 180 are mounted through a shield 182 which is shown schematically in Figure 1.

It is now possible to describe the operation of this V. H. F. section of the present tuner. When, for example, channel 2 is desired, then the appropriate channel boards 60 and 115 are connected to the stationary contacts A, B, C, D, E, F, G, H, K, L, and M so that the elements mounted on panels 60 and 115 are those which correspond to the frequencies of channel 2 (54–60 mc.).

The signal of the correct frequency which appears on antenna 50 mixed with other undesired signals is selected by the input circuit of the R. F. amplifier 75. It will appear properly amplified at the output of this amplifier, namely across inductance 116.

At the same time, oscillator tube 146 produces signals of the correct frequency across inductance 118. The input signals and the oscillator signals are coupled into the input inductance 117 of converter tube 127 and mixed at converter 127 in a manner well known in the art so that across capacitance 142 will appear the desired signal at the desired I. F., at either 21 mc. or at 41 mc. depending on which I. F. is used in the television receiver itself.

In addition to contact M′, also contacts A′, B′, C′, D′, E′, F′, G′, H′, K′, and L′ are mounted on auxiliary assembly 170. The function of the circuits mounted on this auxiliary assembly 170 will be apparent hereinafter when the U. H. F. operation of the present tuner will be described.

Contacts A′ and B′ of assembly 70 are open and contact C′ is connected to the female of an I. F. coaxial connector 185 through a coil 186. Across contacts E′ and D′ is a coil 187 having a variable inductance.

Coils 186 and 187 form an I. F. transformer of which coil 186 is a primary and 187 is a tunable secondary. Connected across contact G′ and F′ is also a variable inductance 190 and across contacts H′ and K′ is connected a parallel circuit consisting of a variable inductance 191 in parallel with resistance 192. Contact L′ is left open and contact M′ as previously mentioned is connected to resistance 163.

The U. H. F. section of the present tuner consists of antenna terminals 200 and 201 mounted externally on the chassis of the present tuner. For proper operation of the present turner, a U. H. F. antenna 202 balanced with respect to ground, is connected to terminals 200 and 201 through a balanced transmission line 203. Connected to terminal 201 is a capacitance 205 having the other side connected to a grounding plate 206. Terminal 200 is connected to a capacitance 207 in series with another capacitance 2–8 terminated at stationary contact N. Connected between the common point between capacitances 207 and 208 and ground is an inductance 210 and connected between stationary contact N and ground is an inductance 211. In parallel with the inductance 211 is a trimmer capacitance 212.

All the elements in the input to the U. H. F. tuner described up to now form a filtering circuit to essentially pass only U. H. F. signals and discriminate against V. H. F. signals. Another stationary contact P is connected to grounding member 206 and in alignment with contacts N and P is a third contact Q connected to ground through trimmer capacitor 213. Connected across contacts P and Q is an inductance 214 and connected across N and Q is a R. F. coupling capacitor 215 providing a constant band width for all the U. H. F. bands.

When the present tuner is operated as a U. H. F.

tuner, a panel 220 is connected to contacts N, P, Q, R, S. Panel 220 carries tuning elements and more precisely it carries a plate 221 of a capacitor 222 where plate 221 is connected to a movable contact 223 through a coil 224. The other plate 225 of capacitor 222 is connected to contact 226.

Another plate 228 is connected to contact 229 through coil 230. Plate 228 forms with previously mentioned plate 225 a second capacitor 231. Also mounted on panel 220 is a third capacitor 232 having one of its plates 233 connected to a coil 234 and thence to a contact 235. The second plate 236 of capacitor 232 is connected to contact 237 through coil 238.

A lead 240 having probes 241 at its two ends serves as the injecting device between coil 234 and coil 230 for injecting an oscillator signal into a crystal mixer as described hereafter.

During operation of the U. H. F. tuner, plate 221 is connected through coil 224, contacts 223 and N, to the input filter of the U. H. F. tuner. Plate 225 is connected to ground through contacts 226, P and plate 228 is connected to crystal mixer 239 through coil 230, contacts 229 and Q.

One side of crystal 239 is connected to an extension of the ungrounded plate of capacitor 213. The other side of crystal 239 is connected to coaxial cable 242 through feed-through capacitor 245. Feed-through capacitor 245 is provided at the crystal end with a receiving member cup-shaped for receiving one terminal 243 of crystal 239. Plate 233 of capacitor 232 is connected to the stationary contact R through coil 234 and movable contact 235 while plate 236 is connected to contact S through coil 238 and movable contact 277. Stationary contact R is connected to plate 247 of U. H. F. oscillator tube 248. Plate 247 is connected to power plug 249 through dropping resistance 250 and feed-through capacitor 251. Plate 247 is also connected to plate 252 of a capacitor assembly 253 which has its other plate 254 connected to contact S and grid 255 of tube 248 and a center conductive member 256 connected to ground and movable with respect to plates 252 and 254 to vary the capacitance between plates 252 and 254 and conductive elements 256.

Grid 255 is connected to ground through a grid leak resistor 258 while cathode 259 of tube 248 is connected to ground through coil 260.

Filament 261 of tube 248 is connected on one side to coil 262 and thence to ground and on the other side to coil 263 feed through capacitor 264 and one contact of power plug 249. Connected across filament 261 is also a capacitor 265. Feed-through capacitors 251 and 264 are mounted through a grounded shield shown in Figure 1 at 265 while feed through capacitor 245 is mounted through a vertical wall of bracket 422.

Panel 220 is mounted together with similar panels to form the U. H. F. turret. This turret is operated by a shaft or a sleeve depending on mechanical details and concentric with this shaft or sleeve, as will be seen hereinafter, is another controlling member carrying a series of dielectric plates, namely plates 267, 268 and 269, where plate 267 serves to vary the capacitance of capacitor 222, plate 268 varies the capacitance of capacitor 231, and plate 269 varies the capacitance of capacitor 232.

In addition, a third controlling member serves to move another dielectric plate 270 to vary by small amounts the capacitance of capacitor 232.

It should be noted that in the present invention, each panel 220 is used to pass and select a U. H. F. range encompassing ten U. H. F. channels.

It is now possible to describe the operation of the U. H. F. section of the present tuner. U. H. F. signals picked up by antenna 202 pass through the input filter described above and a particular U. H. F. channel is selected through the appropriate panel 220 and the appropriate positioning of plates 267 and 268.

This incoming U. H. F. signal is then applied to the input of crystal mixer 239. At the same time, dielectric plates 269 and 270 may be properly positioned with respect to plates 233 and 236 of capacitor 232 so as to cause oscillator 248 to geneate the desired frequency signal. This signal is injected by means of injection device 240 into coil 230 and thence again into the input of crystal mixer 239.

When the frequency of oscillation of oscillator 248 and the frequency of the U. H. F. signal mix in crystal mixer 239, an output is obtained having the desired intermediate frequency of 21 or 45 mc. depending on the intermediate frequency of the television set itself. In the present invention, during U. H. F. reception, the cascode amplifier 75 and the converter 127 of the V. H. F. section are utilized as intermediate frequency amplifiers while the V. H. F. oscillator is made inoperative.

During U. H. F. reception, in fact contacts A–B–C–D–E–F–G–H–K–L–M are disconnected by means of a switching device from the contacts mounted on the V. H. F. turret and are caused to engage contacts A'B'C'D'E'F'G'H'K'L'M' respectively of assembly 170. When this connection is made, as can be clearly seen in Figure 1, contacts A and B will be shorted and connected to ground. Contact C will be connected to coil 186 through the complementary contact C' and since a co-axial cable 242 engages the co-axial connecter 185, the I. F. signal from crystal mixer 239 will appear across coil 186.

Across contacts E and D is now connected coil 187 through complementary contacts E' and D'. Coil 187 being mutually coupled to coil 186 will have across the terminals E' and D' and therefore across its contacts E and D, the I. F. signal which is then applied to cascode amplifier 75 now operating as an I. F. amplifier, that is a fixed frequency amplifier. The output of cascode amplifier 75 appears across a coil 190 through engagement of its terminals F' and G' with stationary contacts F and G.

The signal across the inductive load 190 is applied through series network 193—194 to the input circuit 191—192 having its terminals H' and K' now connected to contacts H and K of the input of tube 127. Tube 127 now operates as another I. F. amplifier so that across capacitor 142 will now appear an I. F. signal containing the information existing in the original U. H. F. signal.

The signal appearing across capacitor 142 has now been considerably amplified by the cascode amplifier 75 and amplifier tube 127.

Since now no circuit element is connected between contacts L and M and contact M is connected to contact M' to short circuit resistances 158 and 163, oscillator tube 146 is made for all practical purposes inoperative so that it cannot produce interference or noise signals. Resistance 163 serves to keep alive the voltage to the U. H. F. oscillator tube 248 when the tuner is in V. H. F position.

It should be noted that whether operating as a V. H. F. or U. H. F. tuner plug 249 and receptacle 171 are always properly connected together by means of conductors (not shown) in a manner well known in the art.

A side cut away view of the tuner of the present invention is shown in Figure 2. The V. H. F turret 300 is seen to consist of antenna segments 60 and oscillator segments or panels 115. The panels are mounted to form turret 300 on three supporting discs, 298, 299 and 301. The two lateral ones 298 and 299 and the center one 301 are provided with appropriate notches such as 302 engageable by roller 303 carried by a spring member 304 secured to the metallic chassis 305 and extending through an opening 308 of member 304. For greater details on the construction of the V. H. F. turret reference is made to Patent No. 2,496,183 to Thias.

The three supporting discs for turret 300 are secured to a shaft 310 (see Figure 2*a*) extending through the whole length of the tuner and more particularly extending beyond the end wall 312 of chassis 305 in V-shaped opening 313 at its end 315. V-shaped opening 315 is engaged by a reentrant portion (not shown) of shaft 310 so that the V-shaped portion of end wall 312 acts as a bearing for shaft 310.

End wall 312 is stamped so that two pockets 316 and 317 are obtained on each side of opening 313. Simple wire spring 318 is used to bias shaft 310 against the V-shaped opening 315 so that shaft 310 may not move away from its V-shaped bearing 315. Wire spring 318 engages at its ends the openings provided by pockets 316 and 317 and engages centrally the above-mentioned end of shaft 310.

The co-axial terminal 185 is mounted on the upper surface of chassis 305 and in Figure 2 coaxial terminal 185 is shown in engagement with the coaxial cable 242.

Also mounted on the upper surface of chassis 305 is the V. H. F. in put circuit described in connection with Figure 1 of which only terminals 320 and 321 are visible in Figure 2. To terminals 320 and 321 are connected during its use the two conductors of a balanced transmission line originating from V. H. F. antenna 50 as is well-known in the art.

Similarly mounted on the upper surface of chassis 305 are the cascode amplifier tube 75 and the oscillator converter tube 127—146. Also visible on the upper surface 305 are trimmer capacitors described in connection with the V. H. F. section of Figure 1. Fixedly mounted on a plastic member 325 and secured in the interior of the upper surface of chassis 305 are the stationary contacts A–B–C–D–E–F–G–H–K–L–M.

These contacts are riveted at 326 to the plastic insulating support 325. Contacts A to E engage, during V. H. F. operation, movable contacts 66, 67, 69, 71 and 70 respectively of panel 60.

It is also found that providing a centrally located ground contact 69 and by separating the two coils so that one is mounted close to the other but not over the other, it is found that the capacity to the secondary is greatly reduced. It can also be said that the position of the grounding contact 69 between the two coils of the input transformer 65—68, which are reverse helices, reduces stray capacity. Stationary contacts F to M engage during V. H. F. operation the turret mounted contacts 120—121—123—122—124 and 125 respectively as shown also in Figure 1.

Referring again to Figure 2, the U. H. F. turret 340 is formed by a series of panels 220 supported and mounted on end discs 341 and 342 (see also Figures 12, 13, 16, 17 and 19). Disc 341 is provided with a number of slots 344 rectangularly shaped to be engaged by an extension 345 of panels 220. In addition to having a number of slots 344 equal to the number of panels to be mounted on supporting disc 341, disc 341 has what may be called a V. H. F. position shown in Figure 13 at the V-shaped notch 346. Slightly to one side of notch 346 is an opening 347 also in disc 341 which, as seen hereinafter, permits adjustment of the V. H. F. oscillator coils from the front end of the tuner during V. H. F. reception. End plate 341 is metallic and thus serves also as the ground plate for the adjusting screws 348 for the oscillator capacitor 232.

Figure 7:
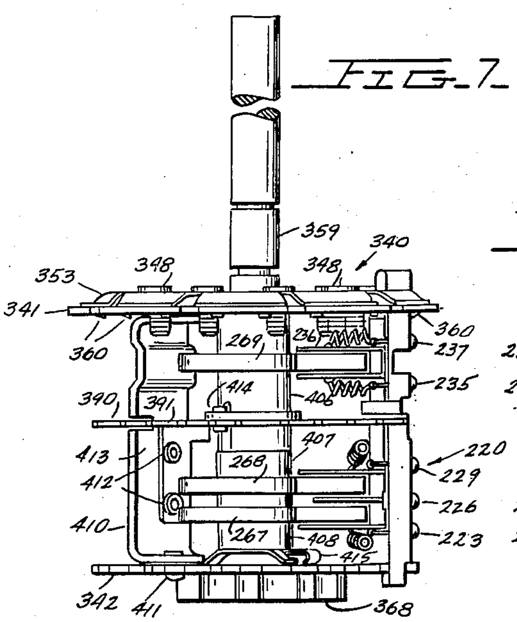

It may be seen, in fact, in Figure 7 that adjusting screws 348 after engaging conductive discs 341 extend close to plate 236 of oscillator capacitor 232 so that the position of adjusting screw 348 with respect to that of plate 236 will determine the amount of capacitance to ground between plate 236 of capacitor 232 and adjusting screw 348.

The adjusting screws 348 engage conductive disc 341 through appropriate threaded openings and are held against undesired movement by wire springs 350 and 351 appropriately bearing against the threads of adjusting screws 348. Riveted on the external part of disc 341 is a spring disc 353 shown in detail in Figures 14 and 15. Disc 353 is provided with openings 354 which are similar to openings 354 in disc 341 with the addition of a circular portion 355 which serves to permit screws 348 to go through spring discs 353 and engage conductive disc 351. Spring disc 353 is also provided with a larger opening 357 corresponding with notch 346 of disc 341.

Spring disc 353 as seen more clearly in Figure 15 is flat at the center portion 356 and is raised at 358 to form a V-shaped circular band. Spring disc 353 is secured to disc 341 in any known way, for example, by means of rivets.

Both spring member 353 and disc 341 are provided with an appropriately centrally positioned opening to permit their mounting on a shaft 359 (see Figures 2 and 7) which is actually a sleeve through which V. H. F. shaft 310 extends so as to permit control of the V. H. F. turret 300 from the front end of the television tuner.

In the back of disc 341 on each side of each opening 344 are small stamped out retaining elements 360 which, as described hereinafter, serve to retain panels 220 after mounting from moving in the radial direction. The back plate 342 consists of a disc provided with pairs of radially extending fingers 365. Fingers 365 are provided with an enlarged end or head 366 so that after each pair of fingers 365 is made to pass through slot 378 of panels 220, heads 366 will prevent motion of panel 220 away from disc 342 or will prevent radial motion of panels 220.

Disc 342 (Figure 12) is further provided with a centrally positioned cam surface 368 (see also Figure 16). Cam surface 368 is broken for a certain length to permit the insertion of a radially moving piece 369 having also notches such as 370 similar to notches 371 of cam surface 368. Member 369 can move radially since it is provided (see Figures 21 and 22) with longitudinal slot 373 which engages shaft 310 of the V. H. F. turret 300.

Member 369 is also provided with a raised portion 374. Member 369 is, therefore, so shaped that when sector 375 mounted on V. H. F. shaft 310 moves with respect to disc 342, it will engage for a certain angular range the shield or raised portion 374 of member 369 so as to move member 369 in the radial outer direction. When sector 375 does not engage shoulder 374 of member 369, appropriate spring means described hereinafter serve to return member 369 to a lower position as determined by the flat end of slot 373.

Figure 10:
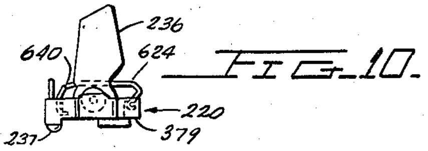
Figure 10 is a side view of the panels of Figure 8.
Figure 8:
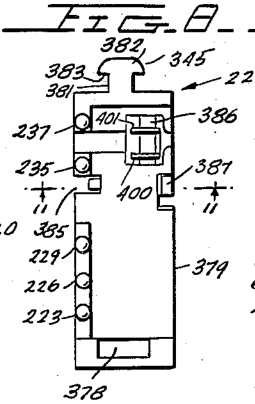
Figure 9:
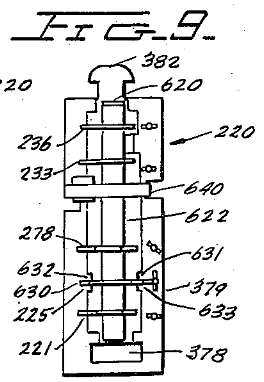
Figure 9 is a bottom view of the panels of Figure 8.
Figure 11:
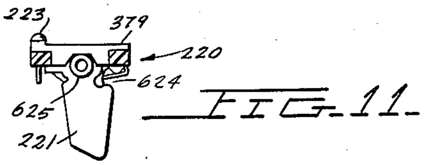
Figure 11 is another side view of the panels of Figure 8.

It was previously mentioned that U. H. F. panels 220 bridge discs 341 and 342 to form the U. H. F. turret 340. Panels 220 (see Figures 8, 9, 10 and 11) are formed of a dielectric base 379. Dielectric base 379 may be a plastic molding provided with two slots 378 and 386 and embossings 385 and 387. The end of base 220 opposite to that in which slot 378 is located is provided with an extension 345 consisting of a head 382 and a neck 381. In the back of head 382 are the two shoulders 383. The molded base 379 is also provided with positioning stop 260 at one end of base 379. Molded base 379 is provided with the U. H. F. contacts 223 226, 229, 235 and 237 extending through the thickness of base 379. Molded base 379 is shaped to receive dielectric cylindrical support 622 in the present embodiment made of an appropriate ceramic such as steatite. The conductive plates 221, 225, 228, 233 and 236 are shaped (see especially Figures 10 and 11) so that one portion of these plates surrounds through a certain angular range the cylindrical support 622.

To be more specific, portion 624 of these conductive plates is circularly shaped and provided with an opening 625 to permit the engagement of support 622. The oscillator plates 233 and 236 are also provided with extensions 400 and 401 which pass through the base 379 through slot 386. Extensions 400 and 401 are appropriately shaped to give the desired value of capacitance during the angular rotation of fine tuning dielectric plate 270 with respect to the plates 400 and 401. In addition, one or more of the conductive plates, in this case 225, is provided near its mounting end with radial extensions 630 and 631 which rest against appropriate embossings 632 and 633 obtained from molding 379 and since the conductive plates are rigidly secured to cylindrical support 622 and one of the plates in this case plate 225 is provided with means which cooperate with bosses 632 and 633, thus making it impossible for plate 225, and therefore, for the whole assembly to rotate with respect to panel 379. In other words, by appropriately shaping molding 379 and providing at least one of the plates mounted on cylinder 622 with radial extensions, it becomes possible to restrict assembly 622, 221, 225, 228, 233 and 236 from rotational movements with respect to plate 379.

If then, the conductive plates are appropriately positioned with respect to the above-mentioned end of ceramic cylinder 622, they will also be properly positioned with respect to the dielectric plates 267, 268, 269 and 270.

To firmly secure the conductive plate assembly to base 379, a clip 640 of resilient material is made to engage slots 385 and 387 to retain ceramic cylinder 622 against motion away from base 379. This type of U. H. F. panel 220 considerably simplifies the manufacturing of these panels since it makes possible the preparation of molded base 379 separately from the conductive plates. Bases 379 are in fact, equal for all the U. H. F. panels 220.

When panels 220 are mounted on the supporting discs 341 and 342, opening 378 is engaged by fingers 365 so that the heads 366 of fingers 365 extend outwardly from turret 340 through opening 378. Also extending outwardly is the extension 390 and the capacitor plate extensions 400 and 401.

Extension 345, or better its neck 381, is introduced in slot 344 of disc 341 so that the shoulders 383 of extension 235 will be brought against portion 358 of spring member 353 so that spring portion 358 will bias panels 220 toward the front and since the interior side of disc 341 is provided with the small extension 360, each panel 220 once mounted cannot be removed through radial movement but must be first pressed against the bias of the spring portion 358 and then moved from the turret by radial movement.

By this means, panels 220 are firmly secured to form turret 340. In the interior of turret 340 and rigidly secured to shaft 310 are dielectric sleeves 406 and 407 carrying, respectively, dielectric plates 269, 268, and 267 of capacitors 232, 231, and 222.

The front plate 341 of the U. H. F. turret 340, as previously mentioned, is secured to a sleeve or hollow shaft 359 so that rotation of the same will cause rotation of the U. H. F. turret 340.

In order to rigidly tie together discs 341, 342, a metallic bridge 410 is provided (see Figure 7) approximately in the position determined by notch 346 (Figure 13). This bar 410 is appropriately riveted such as at 411 to plates 342 and 341, also riveted through rivets 412 to an extension 413 of shielding disc 391.

When notch 346 is engaged by the positioning device of the detent roller as described hereinafter, then because of the position of bar 410 the U. H. F. turret will become inoperative and only the V. H. F. section will be operative so that it is possible to see now that notch 346 corresponds with the position of V. H. F. reception alone.

It should also be noted that in order to provide a really good grounding action and shielding action between the oscillator and the preselector portion of the U. H. F. turret, a flat conductive spring member 414 is connected on one side (not shown) to the shaft 310, while its flat end (see Figure 7) is appropriately bent so that it always bears against the interior portion of shield 391 and thus provides a means for grounding the shaft 310 at that point, shielding well one section of the U. H. F. tuner from the other and, therefore, improving the operation of the U. H. F. section.

It should also be noted that in order to position properly the structure consisting of sleeves 406, 407 and the dielectric plates 267, 268 and 269, the dielectric structure is biased toward the front by a U-shaped spring 415 secured to rear plate 342 in any appropriate way, for example, by means of the previously mentioned rivet 411.

The positioning of dielectric elements 267, 268, 269 longitudinally on shaft 305 in turret 340 is quite important in that their position with respect to the rotor mounted plates 233, 236, 221, 225 and 228 is critical if the tuner is to operate at the desired frequencies.

The U. H. F. turret 340 when mounted as shown in Figure 2 will have the opening 344 or the notch 346 of supporting disc 341 in engagement with the roller 417 mounted on a resilient finger 418. Finger 418 is rigidly secured to chassis 305 through a screw 419, and a positioning extension 423. Through the detent action provided by element 418 and roller 417 over the outer surface of disc 341, it is possible to accurately position contacts 223, 226, 229, 235, 237 and to accurately position panels 220 with respect to the stationary contacts of this U. H. F. turret.

Stationary contacts N, P, Q, R, S are mounted by means of rivets 420 to a dielectric supporting bar 421 which is in turn secured through bracket 422 to the chassis 305 of the present tuner. Mounted on the same bracket 422 and secured to it in any appropriate way is the grounding contact 392 for grounding shield 391 through its extension 390.

Secured to the front wall 425 of chassis 305 is an additional grounding contact 426 which is continuously engaged by the outwardly extending portions of conductive discs 341, thus providing a good ground for the disc 341 and, therefore, for the adjusting screws 348. Also mounted on the chassis and in position so as to be complementary and cooperating with shield 391 is a conductive shield 427 which extends transversely in chassis 305 to also divide the oscillator section of the U. H. F. tuner from the preselector section.

By the provision of shielding means 391 and 427 it is possible to reduce considerably any oscillator radiation. When the tuner is mounted, the panel mounted contacts bear against the kidney spring contacts N to S and through cooperation of roller 417 with notches 344 or 346, the rotary contacts will engage the stationary contacts N to S always at the desired preselected position so as never to change the inductance or the resistance of the path from the stationary contacts to the rotary contacts.

This is particularly important at ultra-high frequencies where any small shift of the contacts with respect to each other may produce detuning of the tuner.

In the foregoing the invention has been described solely in connection with specific illustrative embodiments thereof. Since many variations and modifications will now be obvious to those skilled in the art, it is preferred to be bound not by the specific disclosures herein contained but only by the appended claims.

What is claimed is:

1. A panel for a turret tuner; said panel comprising an insulating base; a plurality of reactance components supported on a surface of said panel; a plurality of contact members carried on another surface of said panel; circuit connections between said reactance components and said contact members; said panel also carrying a plurality of stator plates of a variable capacitor; said stator plates being secured to the surface of the panel to which the reactance components are secured, and additional means on said surface for maintaining the stator plates parallel to each other.

2. A panel for a turret tuner; said panel comprising an insulating base; a plurality of reactance components supported on a surface of said panel; a plurality of contact members carried on another surface of said panel; circuit connections between said reactance components and said contact members; said panel also carrying a plurality of stator plates of a variable capacitor; said stator plates being secured to the surface of the panel to which the reactance components are secured, and additional means on said surface for maintaining the stator plates parallel to each other; said additional means comprising a cylindrical member secured to said surface; and a recess in each stator plate engaging said cylindrical member; the plates extending in a plane normal to said cylindrical member.

3. A panel for a turret tuner; said panel comprising an insulating base; a plurality of reactance components supported on a surface of said panel; a plurality of contact members carried on another surface of said panel; circuit connections between said reactance components and said contact members; said panel also carrying a plurality of stator plates of a variable capacitor; said stator plates being secured to the surface of the panel to which the reactance components are secured, and additional means on said surface for maintaining the stator plates parallel to each other; said additional means comprising a cylindrical member secured to said surface; and a recess in each stator plate engaging said cylindrical member; the plates extending in a plane normal to said cylindrical member; said cylindrical member also furnishing a support for at least certain of said reactance components.

4. In a rotatable turret tuner, a plurality of panels extending parallel to the axis of said tuner, each panel comprising an insulating base; a plurality of reactance components supported on a surface of said panel; a plurality of contact members carried on another surface of said panel; circuit connections between said reactance components and said contact members; said panel also carrying a plurality of stator plates of a variable capacitor and a plurality of rotor plates mounted on a rotatable shaft; said rotatable shaft extending parallel to the axis of the turret and in a fixed position with respect thereto; the stator plates of each panel meshing with said rotor plates when the turret is rotated to bring said panel to a predetermined angular position.

5. In a rotatable turret tuner, a plurality of panels extending parallel to the axis of said tuner, each panel comprising an insulating base; a plurality of reactance components supported on a surface of said panel; a plurality of contact members carried on another surface of said panel; circuit connections between said reactance components and said contact members; said panel also carrying a plurality of stator plates of a variable capacitor and a plurality of rotor plates mounted on a rotatable shaft; said rotatable shaft extending parallel to the axis of the turret and in a fixed position with respect thereto; the stator plates of each panel meshing with said rotor plates when the turret is rotated to bring said panel to a predetermined angular position, the stator plates of the particular panel which is moved to the angular position in which the stator plates of the panel mesh with the rotor plates forming at least one variable capacitor.

6. In a rotatable turret tuner, a plurality of panels extending parallel to the axis of said tuner, each panel comprising an insulating base; a plurality of reactance components supported on a surface of said panel; a plurality of contact members carrie on another surface of said panel; circuit connections between said reactance components and said contact members; said panel also carrying a plurality of stator plates of a variable capacitor and a plurality of rotor plates mounted on a rotatable shaft; said rotatable shaft extending parallel to the axis of the turret and in a fixed position with respect thereto; the stator plates of each panel meshing with said rotor plates when the turret is rotated to bring said panel to a predetermined angular position, the stator plates of the particular panel which is moved to the angular position in which the stator plates of the panel mesh with the rotor plates forming at least one variable capactitor, a plurality of stationary contacts, the contact members of the panel which is located at a position for its stator plates to mesh with the rotor plates engaging the stationary contacts.

7. A panel for a turret tuner; said panel comprising an insulating base; a plurality of reactance components supported on a surface of said panel; a plurality of contact members carried on another surface of said panel; circuit connections between said reactance components and said contact members; said panel also carrying a plurality of stator plates of a variable capacitor; said stator plates being secured to the surface of the panel to which the reactance components are secured, at least one pair of adjacent stator plates extending through the panel and emerging on the opposite side thereof to form an additional pair of stator plates.

8. In a rotatable turret tuner, a plurality of panels extending parallel to the axis of said tuner, each panel comprising an insulating base; a plurality of reactance components supported on a surface of said panel; a plurality of contact members carried on another surface of said panel; circuit connections between said reactance components and said contact members; said panel also carrying a plurality of stator plates of a variable capacitor; said stator plates being secured to the surface of the panel to which the reactance components are secured and a plurality of rotor plates mounted on a rotatable shaft; said rotatable shaft extending parallel to the axis of the turret and in a fixed position with respect thereto; the stator plates of each panel meshing with said rotor plates when the turret is rotated to bring said panel to a predetermined angular position, at least one pair of adjacent stator plates extending through the panel and emerging on the opposite side thereof to form an additional pair of stator plates, and an additional fine tuning rotor plate meshing with said extending stator plates.

References Cited in the file of this patent

UNITED STATES PATENTS

| | | |
|---|---|---|
| 1,664,685 | Hudson | Apr. 3, 1928 |
| 1,908,694 | Danielson | May 16, 1933 |
| 2,545,681 | Zepp et al. | Mar. 20, 1951 |
| 2,611,807 | Lazzery | Sept. 23, 1952 |